United States Patent
Buoli et al.

(10) Patent No.: US 6,597,247 B1
(45) Date of Patent: Jul. 22, 2003

(54) CIRCUIT FOR THE FREQUENCY MULTIPLICATION OF AN ANGLE MODULATED SIGNAL USING A PLL AND METHOD

(75) Inventors: Carlo Buoli, Mirandola (IT); Gianluigi Falasco, Muggio' (IT); Paolo Micheli, Sesto San Giovanni (IT)

(73) Assignee: Siemens Mobile Communications S.p.A., Milan (IT)

( * ) Notice: Subject to any disclaimer, the term of this patent is extended or adjusted under 35 U.S.C. 154(b) by 0 days.

(21) Appl. No.: 09/831,563

(22) PCT Filed: Nov. 23, 1999

(86) PCT No.: PCT/EP99/09160
§ 371 (c)(1),
(2), (4) Date: Jul. 18, 2001

(87) PCT Pub. No.: WO00/48318
PCT Pub. Date: Aug. 17, 2000

(30) Foreign Application Priority Data

Nov. 25, 1998 (IT) .......................... MI98A2553

(51) Int. Cl.$^7$ ................................. H03L 7/00
(52) U.S. Cl. ....................... 331/17; 331/11; 331/34; 331/175
(58) Field of Search .............. 331/17, 182, 175, 331/11, 34, 40; 455/119, 260

(56) References Cited

U.S. PATENT DOCUMENTS 4,614,917 A * 9/1986 Zelitzki et al. ............. 331/1 A 5,374,903 A 12/1994 Blanton
5,703,538 A 12/1997 Lo et al.

FOREIGN PATENT DOCUMENTS

| EP | 0647033 A1 | 4/1995 |
| FR | 2680615 A1 | 2/1993 |
| WO | 95/17043 A1 | 6/1995 |

* cited by examiner

Primary Examiner—Robert Pascal
Assistant Examiner—Kimberly E Glenn
(74) Attorney, Agent, or Firm—Birch, Stewart, Kolasch & Birch, LLP

(57) ABSTRACT

Is disclosed a method and a relative circuit adapted to transfer to a microwave transmission carrier the angle modulation of an intermediate frequency signal. The conveyor of angle modulation is a PLL (100) which VCO (2) generates the microwave carrier (RF) modulated like the intermediate frequency signal (S4), taken as reference for the phase comparator (10) of the PLL. The comparator receives moreover a copy of the signal generated by the VCO, converted at intermediate frequency (S3) by means of a subharmonic mixer, and it generates an error signal (S5). The PLL comprises further a regulator circuit (101) which maintains automatically constant relation K between the locked band of the PLL and the bandwidth of the reference signal (S4), the lanter being a signal susceptible of band width variations, generally due to the choice of different transmission speeds. Regulator circuit (101) includes an error peak detector (102) and an operational amplifier (103) that compares the peak (S7) with a reference value (VR), obtaining from the difference a control signal (S8) of a variable attenuator (105) of the error signal (S5) which controls the VCO.

30 Claims, 2 Drawing Sheets

CIRCUIT FOR THE FREQUENCY MULTIPLICATION OF AN ANGLE MODULATED SIGNAL USING A PLL AND METHOD

This application is the national phase under 35 U.S.C. §371 of PCT International Application No. PCT/EP99/09160 which has an International filing date of Nov. 23, 1999, which designated the United States of America and was published in English.

FIELD OF THE INVENTION

The present invention relates to the sector of radio signal transmission and more precisely to a method and a relative circuit adapted to transfer the angle modulation of an intermediate frequency to a microwave carrier using a PLL which locked band is automatically adapted to the bandwidth of the intermediate frequency signal. The invention will be hereafter described for the use in telecommunication equipment such as for example in small capacity digital radio links according to a manufacturing sector the applicant is involved in, but it is however understood that the same invention may be advantageously applied in other electronic engineering sectors.

BACKGROUND ART

In radio signal transmitters is universally employed the heterodyne technique that foresees a first conversion at intermediate frequency IF of the baseband signal, the filtering, and a further radio frequency conversion in the specific transmission band of the preselected channel. Analogously, in reception the syntonized channel is first of all converted into intermediate frequency IF, filtered, and then converted in baseband by demodulation. The advantages of this technique are well known. The frequency conversion, both up and down, is carried out transmitting the signal to be converted to a device presenting a not linear transfer characteristic, for example a diode, and piloting conductiont of said device by means of sinusoidal pump signal generated by a local oscillator at a frequency differing from that of the center-band of the radio frequency channel for ±the value of the intermediate frequency. Practically the pump signal is generated by a local Voltage Controlled Oscillator or VCO, inserted in a Phase Locked Loop or (PLL), which is reached by a reference signal provided with great stability in frequency. The functioning of the PLL structures is well-known by those skilled in the art, but it is however opportune to underline the fact such structures comprise generally a frequency divider applied at the output of the VCO to enable the use of reference clock signals with absolutely lower frequencies compared to that of the signal generated by the VCO.

A fundamental problem arising for a company manufacturing professional transmission systems as for example those used in the stations of the sections connected by radio links, is that to achieve excellent functioning performances maintaining however the production cost low. A first difficulty in this sense is given by the necessity to be obliged to employ microwave mixers. A second limitation is given by the difficulty in realising the PLL for the piloting of the aforesaid mixers with very high frequencies, which are in small capacity digital radio links in the range of 15 GHz.

A first solution realised by the applicant to reduce the manufacturing costs at the expenses of an imperceptible reduction of the performances, consists in the use of standard glass reinforced FR4 printed circuits as microwave substrate. Such solution is disclosed in International Application no. PCT/EP98/04028 in the name of the same applicant. The object of the above-mentioned patent application is in fact a microwave VCO realised in planar technology, which layout is obtained on the same fibreglass substrate on which are realised circuits with lower frequency for the control of the VCO. Said new approach has it made possible to reduce the high production costs, thanks to the construction simplification of the circuit modules.

The applicant has recently accomplished a further step forward succeeding to eliminate the mixer used in the transmitters to convert the intermediate frequency signal to microwave. This has been possible by using the VCO, no more to generate the pumping signal, clearly useless if there is no mixer, but rather to generate directly the transmission signal. The innovation has not required outstanding circuit variations in the PLL generating the local oscillator signal, as it has been sufficient enough to replace the previous reference signal for the phase comparator by the intermediate frequency signal to be transmitted. In this way the phase modulation the intermediate frequency signal is affected by will be microwave directly transferred from the VCO of the PLL.

This second solution, that makes use of the embodiment advantages of the first solution, is described in the article entitled "FR4 PCB MODULATION TRANSFER MW VCO UP TO 16 GHZ", authors C. Buoli, G. Mora and L. A. Cervi, published after the Proceedings of the 1997 27th European Microwave Conference. Part 2. Jerusalem, Sep. 8–12, 1997.

FIG. 1 shows a circuit scheme of a PLL 1 realising both known solutions, even if only the second will be considered. The PLL 1 is usefully employed in the low capacity digital microwave radio system transmitters.

With reference to FIG. 1 it is possible to state that the PLL 1 comprises it comprehends a VCO 2, essentially set up by an active element 3 electronically piloted by means of a varactor 4. The signal coming out of the VCO 2 is sent to a microwave buffer 5 placed uphill of a directional coupler 6 distributing the input signal between two output gates. A first of these signals in output from the coupler 6 is sent to a balanced buffer 7 in such a way to obtain in output a transmission radio frequency RF with a right power level and a good degree of isolation. A second signal Si is sent dispatched, by means of a further microwave buffer 8 to a sampling phase detector 9, or SPD which is at its turn fed by a sinusoidal signal S2 generated at a suitable frequency UHF. Said signal is advantageously obtained by means of a VCO at low phase noise. At the output of the phase detector 9, a signal S3 is present, copy of the signal RF translated at intermediate frequency, that reaches a first input of a phase comparator 10 set up by a mixer, at which second input a reference signal S4 arrives, correspondent to an intermediate frequency signal obtained by a modulated phase signal from digital data. At the output of the phase comparator 10 there is therefore an error signal S5 for the control of the VCO 2. This signal passes first of all a loop broad band filter 11, useful to eliminate undesired spurious radiation produced in the PLL 1, the latter being set up by the VCO 2, the phase detector 9, the phase comparator 10, and the loop filter 11. It is important to note the fact that the larger the lock band of PLL 1 is, the higher is its capacity to maintain the lock even if there are sudden phase variations in the modulated reference signal. The loop gain necessary for the good functioning of the PLL is guaranteed by the syntonisation capacity of the oscillator VCO 2 (about 150 MHz/VOLT) and by the sensitiveness of the phase comparator 10 (300/2π mV/rad). In order to enable the locking of PLL 1 to the reference signal during the lighting phase or after a possible out of lock condition of this one, the insertion of an automatic research device of the locking is foreseen on the way connecting the phase comparator 10 to the loop filter 11. For simplicity reasons said known device is not shown in the figure. Regarding the phase detector 9, one of its possible embodiments will be described in details discussing FIG. 2.

Compared to the already known art where the PLL was used to lock at an exact reference the pump frequency of the microwave mixer, the same PLL will now be used in a different way to transfer directly to microwave the phase modulation the intermediate frequency reference carrier is affected by. Therefore the distinctive characteristic is evident between both known solutions just illustrated; it consists in the fact that while in the first case the mixer transfers (converts) in frequency a modulated signal, regenerating it to microwave through a beat, in the second case the PLL copies in the microwave carrier generated by itself the phase modulation of the reference signal, and therefore without the need to transfer the reference signal by means of a beat.

The generality in the transfer of the modulation concerns the so-called angle modulation that is of the phase or the frequency, both of the analogue and digital type, while the amplitude modulation remains obviously excluded. As admitted digital modulations we quote for example the well-known modulations M-FSK, M-PSK, CPM (Continuous Phase Modulation) etc., while the mixed amplitude and phase modulations of the type M-QAM are excluded. As already known there is a mathematical relation between frequency and phase, and therefore between the homonymous modulations, the frequency being nothing else but an instant phase variation, that is the time derivation of the phase.

In the case of the example of FIG. 1 a digital signal is used to operate the CPM 1 modulation of a carrier, so to be able to benefit from the advantages offered by such modulation that, maintaining the phase continuity between two intervals of contiguous signalling, generates extremely contained and constant amplitude spectrum of the modulated signals. All this is translated in the concrete opportunity to save transmission power thanks to the use of radio frequency power amplifiers functioning in class C, followed by a band-pass filter that extracts from the amplified signal only the band of interest.

As already known the amplifiers in class C present the highest performance. With the mixed digital modulations mentioned before it is instead necessary to use some absolutely linear amplifiers in class A, in order to avoid the introduction into the band of the amplified signal any distortions of type AM/AM and AM/PM.

The skilled in the art could probably consider the PLL 1 like a simple angle modulator, but this is not completely correct, even if at a first glance acceptable, because the aforesaid angle modulation pre-exists to the following treatment by the PLL, to which it can only be adapted, but at a higher carrier frequency. Modulation of a signal requires commonly sophisticated realisation schemes, which a PLL is certainly not able to reproduce in case the use of it was wanted to modulate the microwave carrier since the beginning. It is therefore more reasonable to talk about angle modulation transfer, in line with title of the article mentioned in relation to the realisation of a phase modulation conveyor realised by the same applicant from which the invention to be described differs for its originality.

Although all the advantages pointed out until now, the circuit of FIG. 1 may nevertheless be improved regarding the quality of the generated signal. And this is the main object of the present invention.

The aforesaid circuit in fact does not perform in an optimal way with respect to noise, if, for system convenience reasons it might be advantageous to choose the limitation by a single lock band of the PLL all possible bit-rates foreseen in the digital radio system in which said circuit is used. As an example the foreseen transmission speeds are the following: 2×2 Mbit/sec, 4×2 Mbit/sec, 8×2 Mbit/sec, and 16×2 Mbit/sec. Supposing to vary occasionally the transmission speed for changed traffic requirements maintaining nevertheless unchanged the particular digital modulation initially predetermined, will than vary according the transmission band. Obviously the PLL lock band has to be sized for the higher transmission speed and in this way it will turn out to be oversized for the minor bit-rates. Due to the oversize the spurious and harmonic ones produced by the signal IF or generated by the modulation system itself are captured by the PLL and amplified.

In case instead the bit-rate of the modulators used in all stations of a radio system has been predefined for all of them during the engineering step, the inconvenience just pointed out could be avoided by optimising the passband of the PLL according to the bit-rate. But in this case there would be anyhow the problem to be obliged to keep the same number of modulation conveyor circuits in the catalogue as that of the bit-rates foreseen between the terminal stations of a determined radio system.

But the lock band differs also according to the variation of certain physical parameters of the devices used in the PLL, i.e. for example it varies according to the sensitivity of the VCO with the functioning temperature of the equipment that they have to be able to tolerate variations comprised between −40° and +75° according to the installation sites, it may vary due to the ageing of the devices setting up the PLL and also according to the frequency shifting to the right or the left of the carrier given that the system is only in theory perfectly symmetric. All this requires to foresee an ample margin of security and to use bands which are largely oversized compared to the actual transmission needs which emphasises the above-mentioned drawbacks (especially at the lowest bit-rates), and it makes the respect of the functioning masks approuved by international standardization autorities for the approval of the single systems even more difficult.

The previous considerations may be extended, with the due distinctions, even regarding the angle modulations of the analog type.

Referring to what said before, a transmission system using the angle modulation conveyor realised according to the circuit scheme of FIG. 1 presents the drawback of not being able to maintain unchanged the quality of the signal transmitted with the variation of the use and installation conditions. Therefore the technical problem deriving from that is that to obtain in an absolutely automatic way a constant and optimal quality of the transmitted signal even if the above-mentioned conditions change or, said in an equivalent way, a lock band of the angle modulation conveyor PLL limiting itself in an adaptive way to the value of the band of the reference signal. Under this introductory statement, the spurious an harmonics produced by the intermediate frequency or generated by the modulation system itself will be automatically filtered by the PLL, and the noise will turn out reduced as a whole all to the advantage of the spectral purity.

SUMMARY OF THE INVENTION

The present invention offer a solution to the above-mentioned technical problem as it is addressed to a method adapted to transfer to a transmission frequency carrier the angle modulation of a carrier at a lower frequency used by a phase lock mesh, or PLL, as a modulated reference signal to generate said radio frequency carrier by means of a voltage controlled oscillator or VCO, the lock band of the PLL being susceptible of band width variations due to changed traffic requirements, thermic variations, ageing of the used electronic devices.

Said method including the following steps of:
a) frequency conversion of the signal generated by the VCO at said lower frequency;
b) phase comparison between said signal converted at a lower frequency and said modulated frequency signal to achieve an error signal for the control of the VCO;
characterised in that it includes furthermore the steps of:
c) detection of the peak value of said error signal;
d) generation of a regulation signal of the lock band of said PLL as the difference between said peak value and a predetermined reference value;
e) attenuation of the level of said error signal in relation to the value of said regulation value of the lock band of the PLL, maintaining in this way the relation K between the lock band of the PLL and the band width of said modulated reference signal, as described in claim 1.

Favourably said radio frequency carrier occurs during the interval of the microwaves and said carrier with a lower frequency has a suitable intermediate frequency. Nevertheless, in a principle, it is not possible to exclude practical subjects, where the modulation transfer may occur directly from base-band to microwave.

A further object of the present invention is a conveyor circuit with angle modulation radio frequency, based on a PLL which functioning is in compliance to the method illustrated before and disclosed in claim 13.

The PLL of the modulation conveyor circuit object of the present invention has the advantage to have a lock band limited in an adaptive way to the value of the band width of the reference signal, which for a signal modulated in the analog way depends on the modulation index and on the peak amplitude value of peak of the modulating signal, while for a digitally modulated signal this depends on the bit-rate of the modulating signal and on the predetermined modulation scheme, as well as on the shape of the modulating pulse.

Thanks to the method proposed by the instant inventors, the PLL of the conveyor circuit presents the further advantage to have a lock band, which is independent, both of the temperature of the environment in which the equipments are working and of the ageing of the devices. In fact, the bandwidth of the reference signal being generally completely independent on the thermic variations and on the ageing, also the lock band of the PLL turns out being dragged due to the constancy of the relation K maintained between these two bands. Therefore the two possible adjustments are unnecessary which otherwise would have to be carried out on the installation sites of the equipment, which are quite often difficult to be reached. Another advantage, which cannot be neglected, is that of avoiding the maintenance in production of different versions of the same circuit for the need of optimising the performances at the different bit-rates.

BRIEF DESCRIPTION OF THE DRAWINGS

The features of the present invention which are believe to be novel are set forth with particularity in the appended claims. The invention, together with further objects and advantages thereof, may be understood with reference to the following description, taken in conjunction with the accompanying drawings and in which:

DETAILED DESCRIPTION OF A PREFERRED EMBODIMENT

Figure 1:
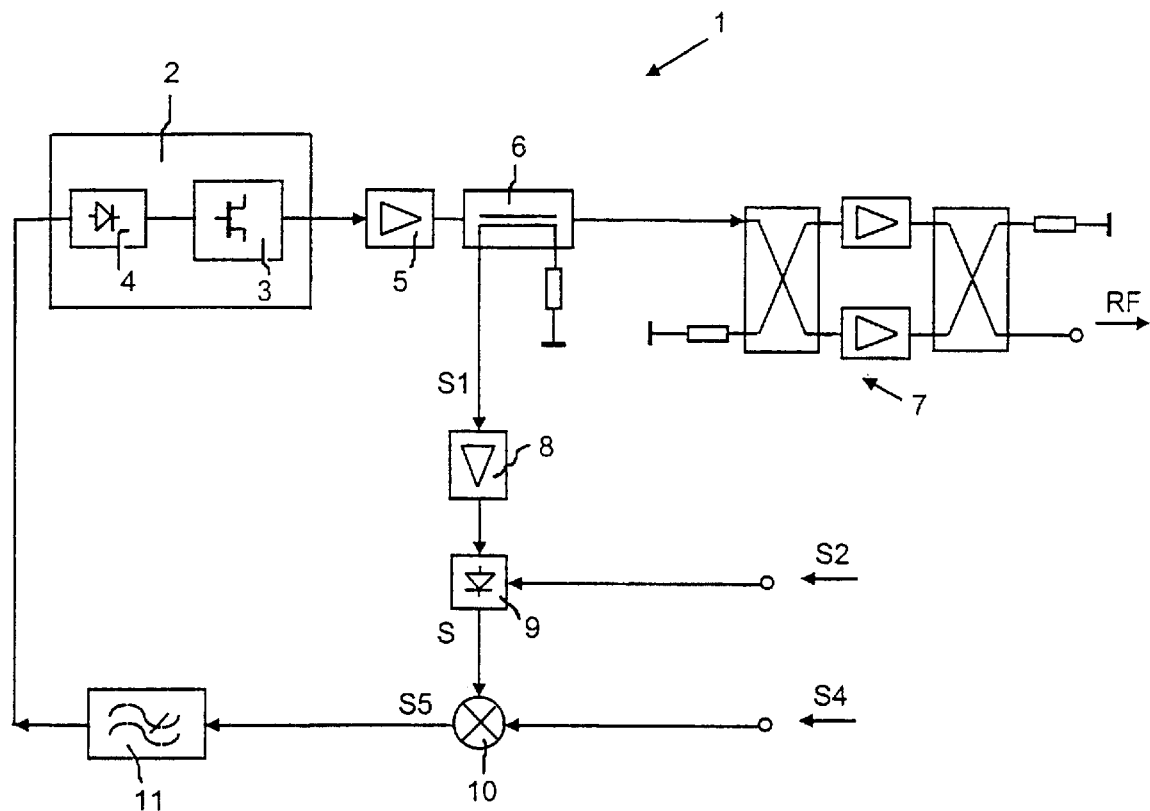
FIG. 1 shows in a schematic way an angle modulation conveyor circuit realised according to the background art.
Figure 2:
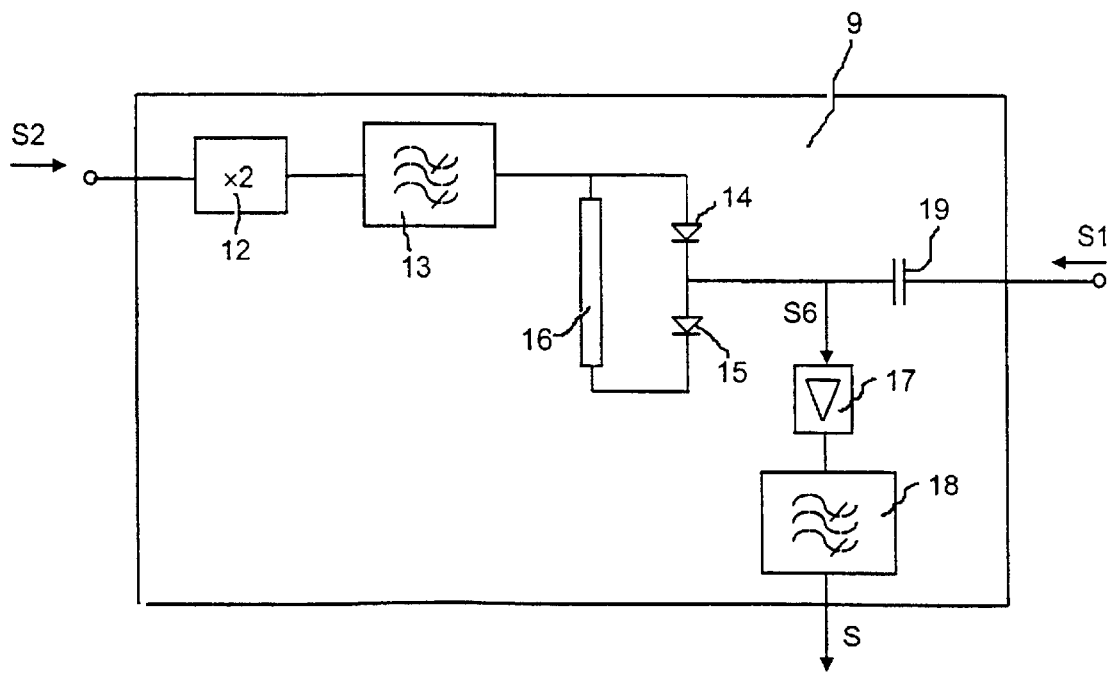
FIG. 2 shows in a schematic way a sampling phase detector used in the circuit of FIG. 1.
Figure 3:
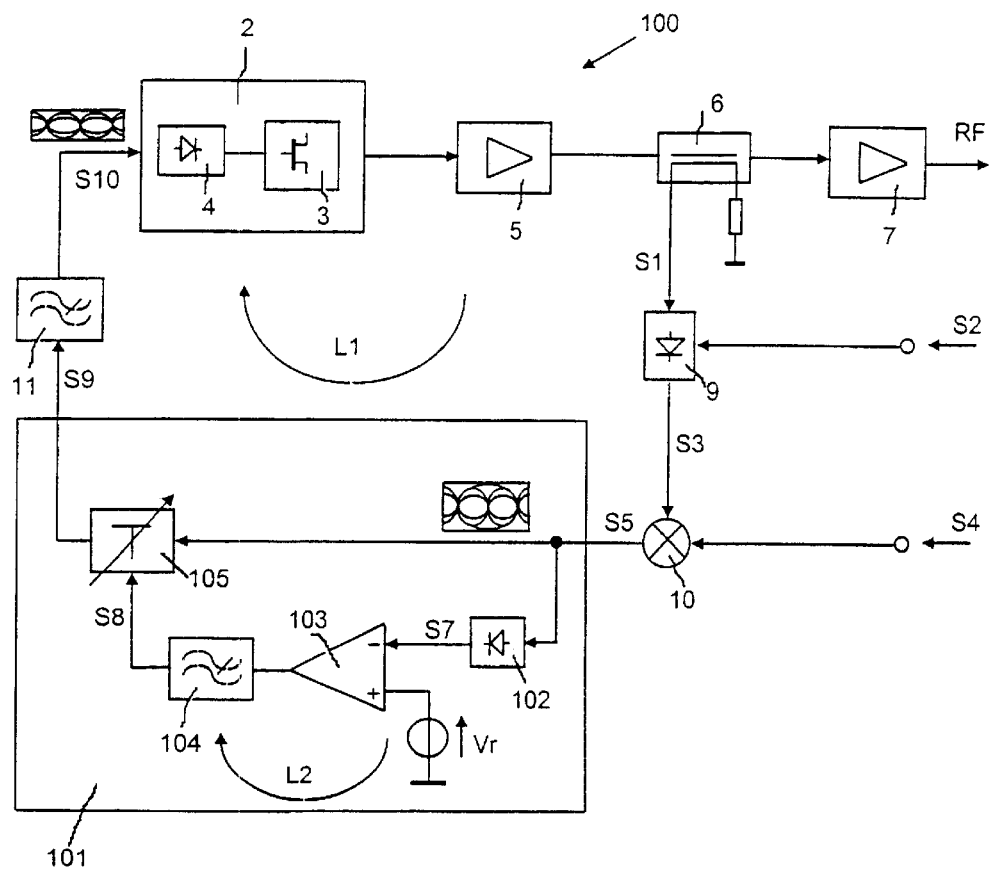
FIG. 3 shows in a schematic way an angle modulation conveyor circuit realised according to the invention.

Referring to FIG. 3 where the elements similar to those present in FIG. 1 are indicated by the same reference numbers, it is possible to see the circuit scheme 100 of a microwave conveyor circuit of the angle modulation of a reference signal with intermediate frequency only differing from the PLL 1 of FIG. 1 by the presence of a block 101 (illustrated by hatching) introduced on the way connecting the output of the comparator of phase 10 to the loop filter 11. Hereafter, for convenience reasons, the modulation conveyor circuit 100 will also be indicated as PLL 100. Regarding the phase detector 9, its particular embodiment will be analysed with the help of FIG. 2. The input signal S4 is CPM modulated as in the case of FIG. 1, but this feature is not to be considered as limiting the object of the invention, as the same signal is susceptible of any of the previously mentioned angle modulations, both analog and digital.

The block 101, that contains substantially the invention, has an entrance at which the output error signal S5 arrives from the phase comparator 10, and an output for a signal S9 that it reaches the loop filter 11, the latter signal, once filtered, constitutes a signal S10 for the control of the VCO 2. Due to the digital modulation the error signal S5 is represented by its oscilloscopic image appearing as an eye diagram.

Inside the block 101 the signal S5 arrives at a peak detector 102 and at a variable attenuator 105 of the controlled type, which attenuated signal corresponds to the output signal S9 coming out of block 101. The peak detector 102 is set up by a diode suitably connected to a capacitor, possibly between the ramification point of the signal S5 and the peak detector 102 there is the possibility to introduce an operational acting in feedback to amplify the signal S5 and to uncouple the block 101 from the phase comparator 10. At the output of the peak detector 102 there is a signal S7 that reaches an entrance– of an operational amplifier 103 in a differential configuration, at which entrance+ is applied a reference voltage Vr of a predetermined value (for example 100 mV). The signal coming out of the amplifier 103 passes through a low pass filter with a narrow band 104, leaving these as an adjustment signal S8 applied at the input control of the variable attenuator 105. The latter is of the known type.

Hereafter is disclosed the fundamental concepts the modulation conveyor circuit 100 of FIG. 3 is based on, referring to what already said regarding the functioning of the known circuit of FIG. 1.

In the case of the example, once the modulation scheme has been predefined and the parameters established which define the behaviour of the PLL 100, i.e. the lock band and the loop gain, in output of the phase comparator 10 an error signal S5 is obtained with a peak value S7 of a certain level, for example 100 mV, generated by the beat between the signals S3 and S4 at the two inputs.

As already said before the idea for the solution of the above-mentioned technical problem is that of using the feedback to maintain constant the relation K between the lock band BA of the PLL 100 and the bandwidth of the signal S4 at an intermediate frequency. It will turn out that said relation K can be maintained constant by maintaining constant the peak value of the error signal S5. The functional block 101 takes care of this scope identifying the peak S7 of the error signal S5 and on the basis of the distance between said peak and the reference value Vr modifies in negative feedback the error signal S5 before this one controls the VCO adapting in this way the lock band BA to the bandwidth of the signal S4.

It is suitable to choose the reference voltage Vr in such a way to be fairly able to face increases and decreases of the bit-rate assuring under whatsoever circumstances a good linearity of functioning of the elements setting up the PLL 100. This is achieved choosing the voltage Vr equal to the peak value S7 which is determined in the presence of a bit-rate 8×2 Mbit/sec which is, as already said, 100 mV.

Inside of the modulation conveyor 100, according to the invention, two negative feedback routes can be identified, marked by L1 and L2, respectively. The route L1 differs from the feedback route of any PLL, as for example the one of FIG. 1, just for the presence of the variable attenuator 105. The feedback route L2 coincides with the way the error signal S5 takes when passing through the adjustment block 101 to come out as an adjustment signal S8, and therefore the attenuator 105 remains excluded which sets up in any case a communication element between the two routes like the ramification point of the phase error signal S5.

The speed intervention of the PLL 100 is guaranteed by the high loop gain and the wide band of the loop filter 11, which has to be larger than the widest band foreseen for the reference signal S4. For a digitally modulated signal this means that the band of the loop filter 11 has to be wider than the band of the modulated carrier at the highest bit-rate foreseen for a predetermined modulation scheme. The reaction time characterising the intervention of the block 101 is set by the peak maintenance time by the peak detector 102. In order to be able to value the effect of such intervention compared to the speeds with which the phenomena take place the adjustment block 101 has to cope with, it is necessary to define limits to the interval of the possible values of the discharge time constant of the device that memorises the peak S7, i.e. of the peak maintenance time. These phenomena are essentially set up by appreciable traffic variations on the section in radio system such to induce to a change of the bit-rate, by thermic variations that occur in the equipment, and by the ageing of the devices. The bit-rate variation is a sporadic phenomenon, which is faced by the PLL maintaining the loop. But concerning the thermic variations and the ageing, these phenomena are incomparably slower with respect to the time interval during which the error peak occurs due to the maximum instant phase shifting of the modulating signal. Therefore it may seem to be possible to maintain the peak for even a long period compared to the above-mentioned interval without that this would create problems to the PLL, but this is not true because it is also necessary to consider the fact that the PLL may lose the loop and therefore it must be automatically brought back to lock the reference signal. During this step it would be more suitable to avoid the limitation of the lock band of the PLL due to an error peak maintained for a period which is normally necessary for the achievement of the locking absence of the circuit block 101.

The inferior limit of said maintenance time will derive from the following arguments.

The feedback route L1 takes care to maintain the signal RF locked into the reference signal S4, therefore the time constant involved along said route have to be small enough compared to the minor symbol time foreseen for digitally modulated signal in order to enable the quick and correct repetition of the modulation. This is guaranteed by the particular choice of the relation K between the lock band of the PLL 100 and that defined by the maximum instant phase shifting during the (symbol) signalling interval; a value of K comprised between 1 and 2 can guarantee a certain margin of security for the locking, but without however degrading excessively the quality of the transmitted signal.

Quite different is the function of the feedback route L2 which is exactly that already pointed out for the realisation of the present invention and that consists in carrying out the suitable passband corrections of the PLL, acting on the variable attenuator 105 according to the variations of the use or installation conditions.

As already said both routes L1 and L2 are not interdependent, in fact the modulation conveyor 100 according to the invention maintains the relation K constant thanks to the combined action of both negative feedback routes, that means that when a variation of the symbol-rate produces a variation in the peak of the error signal S5 obliging the block 101 to intervene for the readjustment of the PLL lock band, the major or minor fading of the error signal S5 deriving from there induces a induces a suitable variation of the loop gain that cancels gradually the variation in the error peak S7, maintaining consequently constant the relationship K. At the equilibrium the peak value S7 is equal to the reference value VR, and the new gain value is able to generate an error peak value equal to the reference value in presence of the new band width of the intermediate frequency signal S4.

The possibility to obtain a good stabilisation of the value K in the circuit of FIG. 3 is due to the fact that the peak detector discharges slowly, giving time to the PLL 100 to adjust the gain. Nevertheless a too much prolonged discharge would slow down in an unjustified way the reaching of the equilibrium point, while a too short discharge wouldn't enable in fact the achievement, and as a consequence the parity of the error peak and of the reference value and the adjustment of the lock band. Let us set the upper limit of the duration of the peak S7 shorter, or at the most equal time, compared to that normally necessary for the achievement of the lock in absence of the circuit block 101, accomplishing in this way the choice of a superabundant value for precautionary reasons. Now remains the necessity to put an inferior limit to said duration. In the case of digital modulations with equally probable symbols, a reasonable choice is that to maintain the peak S7 for a time at least equal to average duration of the interval between the two frequency deviation peaks of the signal S4, when they occur at the minor foreseen symbol-rate. The value of such interval can be calculated in a theoretical way knowing the adapted modulation scheme. In any case this cannot overcome the value M×T, M being the symbol number of the alphabet used by the modulator and T the signalling interval.

In the case of analogous modulations it is not convenient to apply this approach, as the time interval between two peaks in the frequency deviation is a statistic size that is sometimes little known and that may assume even very high values, which, if applied to the maintenance of the error peak S7 would in fact prevent the PLL from reaching the new balance point. Therefore it is convenient to maintain the peak S7 for a period at least equal to the opposite of the minor bandwidth foreseen for the signal S4.

The parameters defining the intervention speed of the angle modulation conveyor circuit 100 determined as said above only in function of the features of the modulated signal S4 and of the modulating signal (not indicated), manage the adaptive adjustment of the lock band of the PLL100 even concerning the influences on the same due to thermic and ageing variations.

Referring to FIG. 2 the sampling phase detector 9 used in the circuits of the FIGS. 1 and 3 will now be illustrated. It is useful to premise that the choice of a detector of the SPD type (Sampling Phase Detector) based on a subharmonic mixer is a favourable choice in the present case in which the input signal S1 (which phase is to be detected) is at microwaves, as it enables the use of a reference clock with a definitely lower frequency.

As already said before, the phase detector 9 receives in input the angle modulated microwave signal Si coming from the oscillator VCO 2, and the sinusoidal signal S2 with a UHF frequency, and it supplies in output the intermediate frequency signal S3 for the phase comparator 10.

Said phase decoder 9 comprises the series of a frequency duplicator 12 followed by a band-pass filter 13 and by a loop circuit architecture set up by a line section 16 in $\lambda/2$ connected between the two ends of the series of two diodes 14 and 15. The phase detector comprises moreover an intermediate frequency amplifier 17 which input is linked to the central point of the series of diodes and which output is linked to a band-pass filter with intermediate frequency 18. The microwave signal S1 reaches the input of the amplifier 17 and the central point of the series of the diodes through a capacitor 19.

During the functioning, the filter 13 is in narrow band condition in order to let pass through only the duplicated frequency of the signal UHF S2, to be injected into the diode loop as the pump signal of the subharmonic mixer which said loop will set up. Choosing a clock S2 at 1880 MHz, and setting the central oscillation frequency of the VCO 2 to at 15360 MHz, the mixer is pumped at 3760 MHz and the fourth harmonic of the pump signal generated by the mixer produces a beat with the signal S1 at a frequency that enters in the band of the filter at intermediate frequency 18. As the level of such beat S6 is very low, it is necessary to use an amplifier 17 with low phase noise.

A modulation conveyor circuit according to the invention realised as in FIG. 3 has been submitted to experimental tests in the laboratories of the applicant using a microwave oscillator VCO to realise a modulation transfer from 320 MHz to 15 GHz.

Figure 4:
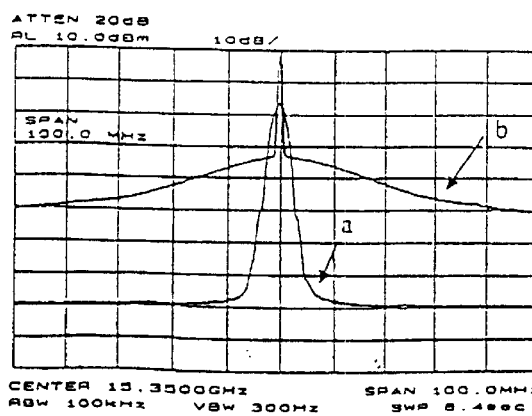
FIGS. 4 and 5 show some experimental results related to the functioning of FIG. 3 in presence of two different bit-rates of the digital input signal.

FIG. 4 shows the spectrum of the modulated signal RF in the case of a bit-rate of 2×2 Mbit/sec (curve a), as well as the automatic adjustment of the lock band at 3 dB with a value of about 5 MHz (curve b).

Figure 5:
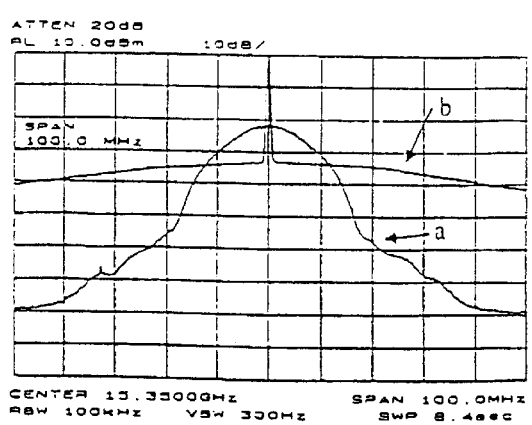

The same prototype has been used for a modulated signal IF with a bit-rate of 16×2 Mbit/sec, and the output RF is shown in FIG. 5 (curve a). FIG. 5 show moreover clearly how, in presence of the new bit-rate, the lock band at 3 dB becomes considerably ampler compared to the example of FIG. 4, in particular about 28 MHz (curve b).

In conclusion, the present invention enables to solve a very strong requirement, that is to say the self-adjustment of the lock band of the PLLs operating as angle modulation conveyors in the transmitters of the digital microwave radio systems according to the bit-rate of the digital transmission signal. It avoids therefore the inconvenience of the systems at present on the market, which are adapted to operate for the worst case regarding the purity of the transmitted signal, that is the one with the major bit-rates.

What is claimed is:

1. Method adapted to transfer to a radio frequency transmission carrier the angle modulation of a carrier with a lower frequency (S4) used by a phase lock mesh (1), or PLL, as a modulated reference signal to generate said radio frequency transmission carrier (RF) by means of a voltage controlled oscillator (2) or VCO, a lock,band of the PLL (1) being susceptible of variations due to changed traffic requirements, thermic variations, ageing of the employed electronic devices, including the following steps:
   a) frequency conversion of the radio frequency transmission carrier generated by the VCO (S1) to a lower frequency;
   b) phase comparison between said radio frequency transmission carrier converted to a lower frequency (S3) and said modulated reference signal (S4) to obtain an error signal (S5) for the control of the VCO;
characterised in that it comprises further the steps:
   c) detection of the peak value (S7) of said error signal (S5);
   d) generation of an adjustment signal (S8) of the lock band of said PLL (1) as the difference between said peak value (S7) and a predetermined reference value (VR);
   e) attenuation of the level of said error signal (S5) in relation to the value of said adjustment signal of the lock band (S8) of the PLL (1), maintaining in this way the relationship K between the lock band of the PLL (1) and bandwidth of said modulated reference signal (S4) constant.

2. Method according to claim 1, characterised in that said relationship K is comprised between 1 and 2 enabling the correct transfer of the modulation without considerably degrading the quality of said radio frequency transmission carrier.

3. Method according to claim 1 or 2, characterised in that the value of said error peak (S7) is maintained for a shorter, or at most equal, time compared to the time which is normally needed by said PLL (1) to achieve the locking in absence of the characterising steps c), d), e).

4. Method according to claim 1, characterised in that said reference value (VR) corresponds to a said peak value (S7) identified in correspondence of a bandwidth of said modulated reference signal (S4) defined in correspondence of a transmission speed of central value with respect to those foreseen.

5. Method according to claim 1, characterised in that the values of said difference realised in said step d) are submitted to a narrow band low pass filtering.

6. Method according to claim 1, characterised in that said angle modulation is a digital modulation.

7. Method according to claim 6, characterised in that the value of said peak value (S7) of the error signal is maintained for a time at least equal to the average duration of the interval between two frequency deviation peaks of said reference signal (S4) modulated in an angle way at the lowest foreseen bit-rate.

8. Method according to claim 6 or 7, characterised in that said digital modulation is of the continuous phase type, also called CPM.

9. Method according to claim 1, characterised in that said angle modulation is an analog modulation.

10. Method according to claim 9, characterised in that the value of said peak value (S7) of the error signal is maintained for a time at least equal to the opposite of the smallest bandwidth foreseen for said reference signal modulated in an angle way (S4).

11. Method according to claim 1, characterised in that said lower frequency of the reference signal modulated in an angle way (S4) has a suitable intermediate frequency value.

12. Method according to claim 1, characterised in that it is used in the transmitters of microwave radio systems.

13. Angle modulation conveyor circuit including:
    a voltage controlled oscillator (2) or VCO used to generate a radio frequency carrier (RF);
    conversion means (9) with a frequency lower than the radio frequency carrier generated by the VCO (S1);
    means for the phase comparison (10) between the radio frequency carrier converted to a lower frequency (S3) and a reference signal (S4) modulated in an angle way and having said lower frequency, to obtain an error signal (S5) that controls the VCO (2);
    said conversion and phase comparison means (9, 10), said VCO (2), and low pass filter (11) of the error signal (S5), constituting a phase lock mesh (1), or PLL, having a lock band susceptible of variations due to changed traffic requirements, thernmic variations, or to ageing of the used electronic devices,
characterised in that it includes moreover:
    means for the adaptive adjustment (101) of the width of said lock band which are controlled by said error signal (S5), whereby said adjustment means act on said error signal (S5) maintaining the relation K between said lock band and the bandwidth of said reference signal modulated to a lower frequency (S4); and characterised in that said means for the adaptive adjustment (101) of the lock band of said PLL (1) includes:
        means for the detection (102) of a peak value (S7) of said error signal (S5);
        subtraction means (103) between said peak value (S7) and a reference value (Vr) suitably chosen to obtain a signal (S8) for the adjustment of the lock band of said PLL (1);
        means for the attenuation (105) of the level of said error signal (S5) controlled by said signal for the adjustment of the lock band (S8).

14. Circuit according to claim 13, characterised in that said PLL (1) guarantees said relation K comprised between 1 and 2, enabling the correct transfer of the modulation without degrading considerably the quality of said transmission carrier (RF).

15. Circuit according to claim 13, characterised in that said peak detection means (102) maintain the detected value (S7) for a time shorter than or at most equal to the time normally needed by said PLL (1) to achieve the locking in absence of said means for the adaptive adjustment (101) of said lock band.

16. Circuit according to claim 13, characterised in that said reference value (VR) corresponds to a said peak value (S7) detected in correspondence of a bandwidth of said modulated reference signal (S4) defined in correspondence to a control transmission speed with respect to those foreseen.

17. Circuit according to claim 13, characterised in that it comprises a second narrow band low pass filter (104) passed through by said adjustment signal of the lock band (S8).

18. Circuit according to claim 13, characterised in that it comprises a second digital modulation.

19. Circuit according to claim 18, characterised in that said peak detection means (102) maintain the detected peak value (S7) for a time which is at least equal to the average duration of the interval between two frequency deviation peaks of said reference signal (S4) modulated in an angle way at the minor foreseen symbol-rate.

20. Circuit according to claim 18, or 11, characterised in that said digital modulation is of the continuous phase type, also call CPM.

21. Circuit according to claim 13, characterised in that said angle modulation is an analog modulation.

22. Circuit according to claim 21, characterised in that said peak detection means (102) maintain the detected peak value (S7) for a time at least equal to the opposite of the minor bandwidth foreseen for said reference signal modulated in an angle way (S4).

23. Circuit according to claim 13, characterised in that said lower frequency of the reference signal modulated in an angle way (S4) has a suitable intermediate frequency value.

24. Circuit according to claim 13, characterised in that it is used in the transmitters of microwave radio systems.

25. A circuit for generating a radio frequency carrier, comprising:
    a voltage-controlled oscillator for generating a radio frequency signal;
    a frequency converter for converting said radio frequency signal to a lower frequency signal;
    a phase comparator for comparing said lower frequency signal with a predetermined angle-modulated, intermediate frequency reference signal to produce an error signal;
    a detector for detecting the peak value of said error signal;
    an amplifier for receiving as inputs said peak value and a predetermined reference signal to output an adjustment signal; and
    a variable attenuator for receiving said error signal as an input and said adjustment signal as an input control to output a control signal for said voltage-controlled oscillator.

26. The circuit of claim 25, wherein said variable attenuator to output the control signal for said voltage-controlled oscillator to maintain a predetermined relation between the bandwidth of said intermediate frequency reference signal and the bandwidth for the voltage-controlled oscillator to generate a radio frequency signal with a substantially constant center frequency value.

27. A circuit for generating a radio frequency carrier, comprising:
    a first feedback circuit loop, comprising:
        voltage-controlled oscillator for generating a radio frequency signal;
        a frequency converter for converting said radio frequency signal to a lower frequency signal;
        a phase comparator for comparing said lower frequency signal with a predetermined angle-modulated, intermediate frequency reference signal to produce an error signal for controlling said voltage-controlled oscillator, and a second feedback circuit loop, comprising:
        a detector for receiving as an input said error signal to detect and output the peak value of said error signal;
        an amplifier for receiving as inputs said peak value and a predetermined reference signal to output an adjustment signal;
        a variable attenuator for receiving said error signal as an input and said adjustment signal as an input control to output a control signal for said voltage-controlled oscillator.

28. The circuit of claim 27, wherein said first and second feedback circuit loop to operate in combination to output the error signal and the control signal to maintain a predetermined relation between the bandwidth of said intermediate frequency reference signal and the bandwidth for the voltage-controlled oscillator to generate a radio frequency signal with a substantially constant center frequency value.

29. A method for generating a radio frequency carrier, comprising:

generating a radio frequency signal;

converting said radio frequency signal to a lower frequency signal;

comparing said lower frequency signal with a predetermined angle-modulated, intermediate frequency reference signal to produce an error signal;

detecting the peak value of said error signal;

generating an adjustment signal from receiving as inputs said peak value and a predetermined reference signal; and generating a control signal for said voltage-controlled oscillator from receiving said error signal as an input and said adjustment signal as an input control.

30. The method of claim 29, wherein said generating the control signal includes generating the control signal to maintain a predetermined relation between the bandwidth of said intermediate frequency reference signal and the bandwidth for the voltage-controlled oscillator to generate a radio frequency signal with a substantially constant center frequency value.

* * * * *